United States Patent [19]

Sakamoto et al.

[11] Patent Number: 5,103,288

[45] Date of Patent: Apr. 7, 1992

[54] SEMICONDUCTOR DEVICE HAVING MULTILAYERED WIRING STRUCTURE WITH A SMALL PARASITIC CAPACITANCE

[75] Inventors: Mitsuru Sakamoto; Kuniyuki Hamano, both of Tokyo, Japan

[73] Assignee: NEC Corporation, Japan

[21] Appl. No.: 677,619

[22] Filed: Mar. 27, 1991

Related U.S. Application Data

[63] Continuation of Ser. No. 324,260, Mar. 15, 1989, abandoned.

[30] Foreign Application Priority Data

Mar. 15, 1988 [JP] Japan .................. 63-62552

[51] Int. Cl.⁵ .................. H01C 17/06; H01C 7/00; H01L 21/88; H01L 29/28
[52] U.S. Cl. .................. 357/71; 437/203
[58] Field of Search .................. 357/71

[56] References Cited

U.S. PATENT DOCUMENTS

| | | | |
|---|---|---|---|
| 3,906,620 | 9/1975 | Anzai et al. | 357/23.9 |
| 4,460,666 | 7/1984 | Dinkler et al. | 429/336 |
| 4,582,575 | 4/1986 | Warren et al. | 204/12 |
| 4,734,754 | 3/1988 | Nikawa | 357/71 R |
| 4,751,136 | 6/1988 | Kamiya et al. | 428/317.1 |
| 4,761,677 | 8/1988 | Sasaki | 357/71 |
| 4,834,034 | 6/1989 | Herndon et al. | 357/71 |
| 4,866,009 | 9/1989 | Matsuda | 357/71 |
| 4,946,709 | 8/1990 | Takada et al. | 427/98 |

FOREIGN PATENT DOCUMENTS

| | | |
|---|---|---|
| 55-95857 | 7/1980 | Japan . |
| 57-99756 | 6/1982 | Japan . |
| 113252 | 7/1982 | Japan . |
| 58-182546 | 10/1983 | Japan . |
| 61-10757 | 1/1986 | Japan . |

OTHER PUBLICATIONS

"Proceedings of Third International IEEE VLSI Multilevel Interconnection Conference", 1986, pp. 100–106.
"Proceedings of First International IEEE VLSI Multilevel Interconnection Conference", 1984, pp. 37–44.
IEEE Journal of Solid-State Circuits, vol. SC-13, No. 4, 1978, pp. 462–467.

Primary Examiner—Andrew J. James
Assistant Examiner—Viet Q. Nguyen
Attorney, Agent, or Firm—Laff, Whitesel, Conte & Saret

[57] ABSTRACT

The semiconductor device of the present invention includes a semiconductor substrate on which are formed semiconductor elements, and a plurality of wiring layers formed on the semiconductor substrate via porous insulating films. The surface of the plurality of the wiring layers is preferably covered with a compact insulating film. The size of the pores in the porous insulating film is preferably 5 nm to 50 nm in diameter, and the volume of the pores in the porous insulating film is preferably 50% to 80% of the total volume of the porous insulating film. The porous insulating film is formed by subjecting a mixed insulating film of a basic oxide and an acidic oxide to a heat treatment to precipitate only either one of the basic oxide and the acidic oxide, and then dissolving out selectively the basic or acidic oxide precipitated.

11 Claims, 3 Drawing Sheets

SEMICONDUCTOR DEVICE HAVING MULTILAYERED WIRING STRUCTURE WITH A SMALL PARASITIC CAPACITANCE

This application is a continuation of application Ser. No. 324,260, filed Mar. 15, 1989, now abandoned.

BACKGROUND OF THE INVENTION

1. Field of the Invention

The present invention relates to a wiring structure for a semiconductor device, and more particularly to a semiconductor device having a multilayered wiring structure with a small parasitic capacitance.

2. Description of the Related Art

With the view toward establishing a larger scale of integration for semiconductor devices, there are strong demands for development of techniques for making the wiring width and wiring spacing more minute and for multilayering of wirings. Under these circumstances, reduction in the parasitic capacitance of wirings becomes important in the wiring technique together with reduction in the wiring resistance. The reason for this is that the parasitic capacitance increases with the increase in the wiring density or with multilayering of the wirings so that it becomes difficult to diminish the power consumption during dynamic operation of semiconductor elements. Furthermore, the reduction in the parasitic capacitance of wirings brings about an improvement in the speed of signal transmission between semiconductor elements which is effective in increasing the operational speed of semiconductor devices.

In order to reduce the parasitic capacitance, it becomes necessary to reduce the relative dielectric constant of the interlayer insulating film between the multilayered wirings. As such interlayer insulating films, there have been known inorganic insulating films like silicon oxide film as disclosed in "Proceedings of Third International IEEE VLSI Multilevel Interconnection Conference," 1986, pp. 100–106 or in. "Proceedings of First International IEEE VLSI Multilevel Interconnection Conference," 1984, pp. 37–44, organic insulating films like polyimide as disclosed in IEEE Journal of Solid-State Circuits, Vol. SC-13, No. 4, 1978, pp. 462–467, and the like. However, since the relative dielectric constant $\epsilon$ of the former examples is on the order of 3.9 and that of the latter is about 3.0, these insulating films cannot be used as interlayer insulating films which satisfies the condition $\epsilon \leq 2.0$ required for improvement of operating speed.

Besides the above, there is known a wiring technique called aerial wiring. In this technique, wiring is formed in the air without insertion of such an interlayer insulating film between metallic wirings. Although this aerial wiring technique makes it possible to attain approximately the condition of $\epsilon = 1.0$, the technique has a drawback in that the wiring metal tends to generate sagging and deformation because of the insufficient supporting portions of the wiring, which causes short-circuiting between the wirings and breaking of the wirings, giving rise the wirings with poor reliability.

SUMMARY OF THE INVENTION

It is, therefore, an object of the present invention to provide a semiconductor device which has a multilayered wiring structure with a small parasitic capacitance.

The semiconductor device in accordance with the present invention includes a semiconductor substrate on which are formed semiconductor elements, and a plurality of metallic wirings formed on the semiconductor substrate, the metallic wirings being formed in a multilayered form with porous insulating films interposed between adjacent wiring layers. Preferably, a porous insulating film is inserted between the metallic wirings as the interlayer insulating material, with the metallic wirings covered with a compact insulating film.

The diameter of the pores of the porous insulating film is preferable to be in the range of 5 to 50 nm, and the volumetric density of the pores of the porous insulating film is preferable to be in the range of 50 to 80%.

Further, the forming process of the porous insulating film preferably includes the steps in which an insulating film which is a mixture of a basic oxide and an acidic oxide is deposited, then only the basic oxide or the acidic oxide is precipitated by a heat treatment, following that, only the basic oxide or the acidic oxide that is precipitated is dissolved. Pores are formed in the portions from which the above-mentioned substance is dissolved.

It is preferable to form the mixed insulating film as a mixture of sodium oxide or calcium oxide and silicon dioxide or silicon dioxide/boron oxide, and it is preferable to have the concentration of sodium oxide or calcium oxide contained in the mixed insulating film to be in the range of 15 to 25 mol %. After preparing the mixture as in the above, sodium oxide or calcium oxide alone is dissolved. In the process of subjecting the mixed insulating film to a heat treatment, it is preferable to set a temperature of the heat treatment in the range of 350° to 500° C.

In the present invention, a porous insulator having a large number of minute pores in an insulating film is used as an interlayer insulating film between the metallic wirings so that it is possible not only to reduce the relative dielectric constant of the interlayer insulating film (to less than or equal to 2) and but also to provide a metallic wiring structure with high reliability.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

(First Embodiment)

Figure 1:
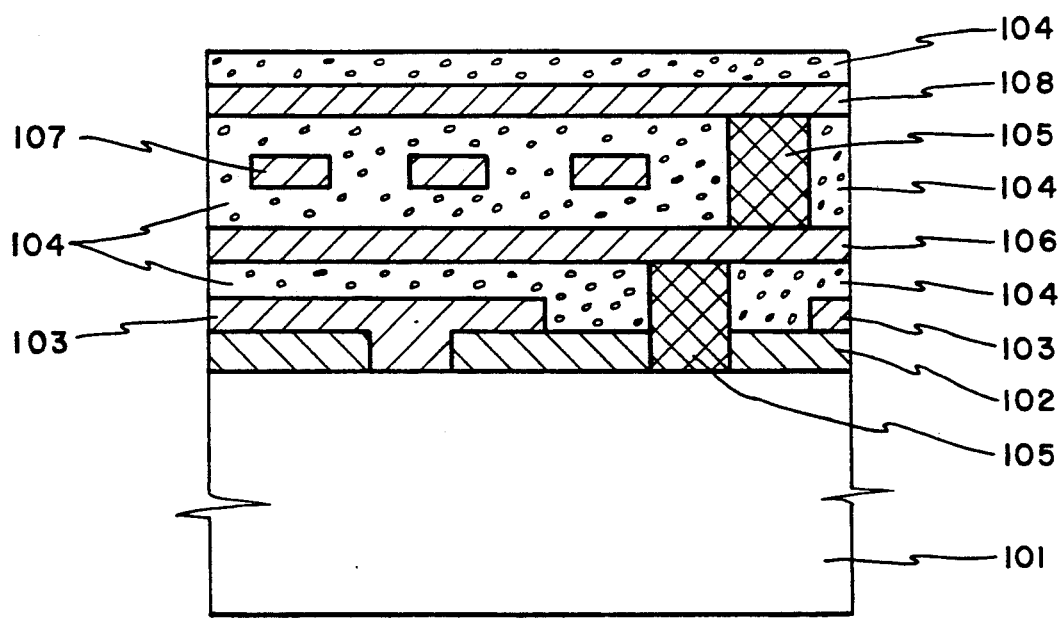
FIG. 1 is a longitudinal cross-sectional view of the semiconductor device of a first embodiment of the present invention.

As shown in FIG. 1, on a surface of a semiconductor substrate 101 having semiconductor elements formed thereon, these is formed an ionorgamic insulating layer 102 such as silicon oxide film, silicon nitride film or silicon oxynitride film as a passivation film. After forming contact holes in the insulating film 102, a first metallic wiring 103 is formed using pure aluminum, aluminum containing silicon or the like, and a porous insulating film 104 is deposited covering the first metallic wiring 103. Here, the porous insulating film 104 consists of an acidic oxide such as $SiO_2$, a basic inorganic insulator such as CaO or $Li_2O$ or an organic insulator such as polyimide with volume density of pores of 50–80%.

Then, after forming a metal 105 in the contact hole by electroless plating or low temperature CVD process, a second metallic wiring 106 is formed using a method similar to that of the first metallic wiring 103. Further, a porous insulating film 104 and a third metallic wiring 107 are formed using means similar to the above, and a metal 105, a fourth metallic wiring 108 and a topmost porous insulating film 104 covering the metallic wiring 108 are formed respectively.

Figure 3:
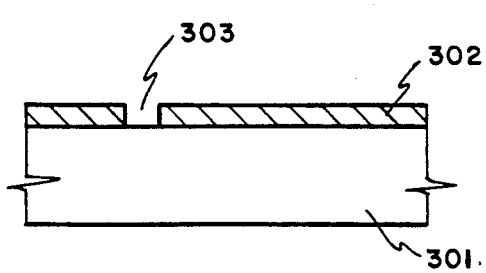
FIG. 3 through FIG. 8 are longitudinal cross-sectional views for explaining a method of manufacturing the semiconductor device of the first embodiment of the present invention.

Next, the method of manufacturing the semiconductor device shown in FIG. 1 will further be described in detail. First, as shown in FIG. 3, on the surface of a semiconductor substrate 301 having semiconductor elements formed thereon, there is deposited an inorganic insulating film 302 with two-layer structure of a silicon oxide film and a silicon oxynitride film. Here, the silicon oxide film is formed to have a thickness of about 1000 Å by a CVD method while the silicon oxynitride film is formed to have a thickness of about 3000 Å by a plasma CVD method.

Figure 4:
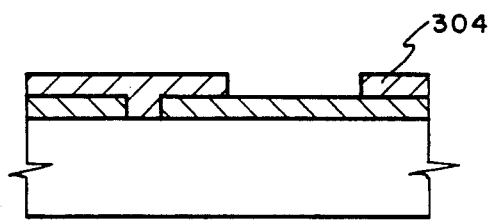

Subsequently, after forming a contact hole 303 using a dry etching method, a first metallic wiring 304 is formed as shown in FIG. 4. The metallic wiring 304 is formed by deposition of pure aluminum metal by sputtering followed by a fine working using dry etching.

Figure 5:
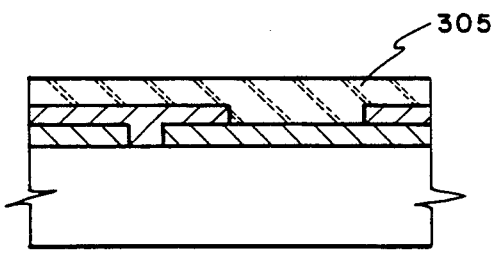

Then, a mixed insulating film 305 consisting of sodium oxide ($Na_2O$) and silicon oxide ($SiO_2$) is formed to have a thickness of 5000 Å as shown in FIG. 5. The mixed insulating film 305 is deposited by a CVD method, a coating method or a sputtering method so that the concentration of sodium oxide is in the range of 15 to 25 mol %. As the coating agent, use is made of a mixture of $R_1Si(OR_2)_3$ or $Si(OR_2)_4$ and NaOH with methyl-cellosolve used as the solvent. In the above, $R_1$ and $R_2$ represent hydrocarbon compounds of the form $C_mH_n$. In the case of formation of the film using the CVD method, deposition is carried out in reaction furnace by mixing $SiH_4$, $N_2O$, NaOH gases or organic silane series gases.

Figure 6:
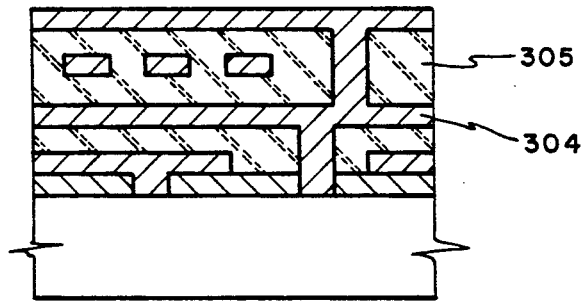

A multilayered wiring is formed by using thus formed mixed insulating films 305 as the interlayer insulating films. The case of building a four-layered metallic wiring is shown as an example in FIG. 6.

Figure 7:
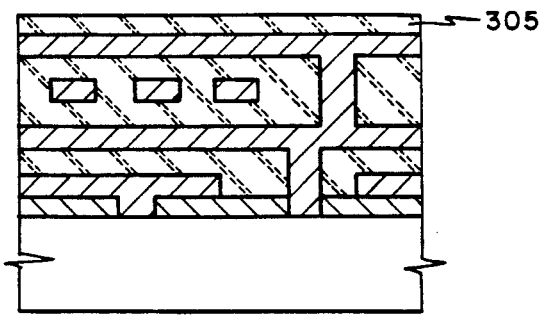
Figure 8:
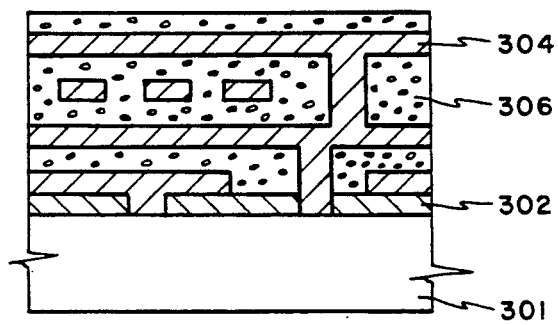

After forming a top layer of mixed insulating film as shown in FIG. 7, the mixed insulating film 305 is converted to a porous insulating film 306 as indicated in FIG. 8.

The conversion is carried out as in the following. A semiconductor substrate in the state of FIG. 7 is subjected to a heat treatment at a temperature in the range of 300° to 500 ° C. in an inert gas such as nitrogen or an oxidizing atmosphere. As a result of such heat treatment, a phase separation phenomenon in which the mixed insulating film 305 is separated into $Na_2O$ and $SiO_2$ takes place, giving rise to a micro-phase separation of "intertwining type" or "droplet type".

Then, by immersing the substrate in an acidic treatment solution such as hydrochloric acid, $Na_2O$ alone is dissolved and there are formed holes in the portions from which $Na_2O$ is dissolved out. The size of these pores depends upon that of $Na_2O$ precipitation at the time of micro-phase separation. Under the conditions of heat treatment described above, there are formed numerous pores with diameter of about 10 nm.

In the above, the case of using the $Na_2O/SiO_2$ system which gives rise to a phase separation phenomenon as the mixed insulating film was described. However, similar effect can be obtained by employing other mixed insulating films of a basic oxide/an acidic oxide system which give rise to the phase separation phenomenon such as $Li_2O/SiO_2$ system and $CaO/SiO_2$ system.

Further, in the above embodiment, description was made in the case of carrying out the phase separation of the mixed insulating film 305 by the heat treatment in the last step. However, microphase separation may be introduced in each formation step of the mixed insulating film by providing heat treatment. It should be noted, however, that the dissolution of the precipitated insulator is to be carried out in the final step.

(Second Embodiment)

Figure 2:
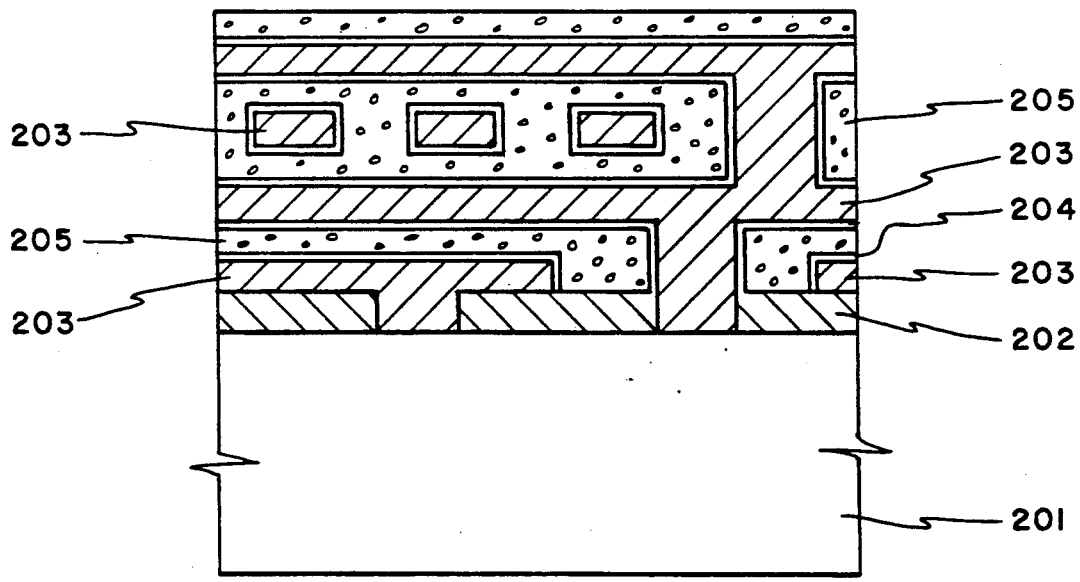
FIG. 2 is a longitudinal cross-sectional view of the semiconductor device of a second embodiment of the present invention.

Referring to FIG. 2, the use of a porous insulating film 205 to be inserted between metallic wirings is analogous to the first embodiment, but a protective insulating film 204 is formed covering the surface of the wiring metals. The protective insulating film 204 is constructed by a compact film with passivation effect such as a silicon oxynitride film of thickness of 100–2000 Å or a silicon nitride film with small stress.

The remaining constitution of the embodiment is the same as that of the first embodiment. Namely, on a semiconductor substrate 201 having semiconductor elements thereon, there is formed an inorganic insulating film 202 with a contact hole to separate the semiconductor substrate 201 from multilayered wiring layers to be laminated on it. Then, metal wiring 203 laminated in the form of a multilayer and porous insulating films 205 serving as interlayer insulating films are formed.

In the case of the present embodiment, wiring reliability can be improved to a large extent by isolating the porous insulating film 205 from the metallic wiring 203 by means of a protective insulating film 204.

Figure 9:
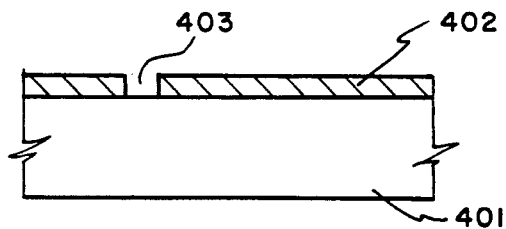
FIG. 9 through FIG. 17 are longitudinal cross-sectional views for explaining a method of manufacturing the semiconductor device of the second embodiment of the present invention.

Next, the method of manufacturing the semiconductor device shown in FIG. 2 will be described in detail. First, an inorganic insulating film 402 is deposited on the surface of a semiconductor 401 and then a contact hole 403 is formed as shown in FIG. 9.

Figure 10:
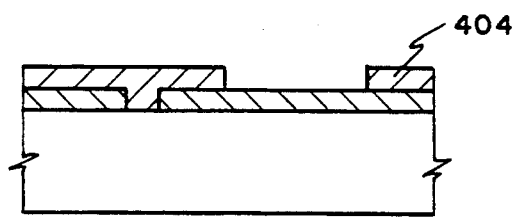

Next, a first metallic wiring 404 is formed as shown in FIG. 10. Up to this step, things are the same as in the first embodiment.

Figure 11:
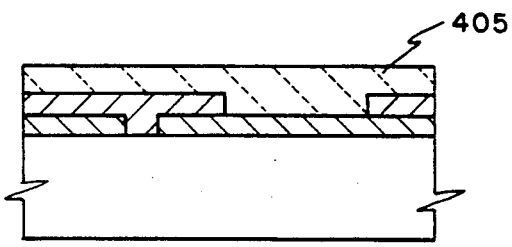
Figure 12:
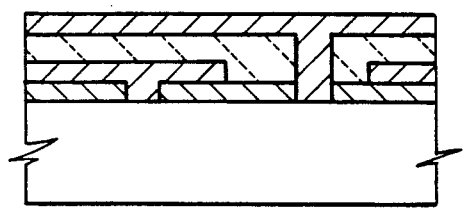
Figure 13:
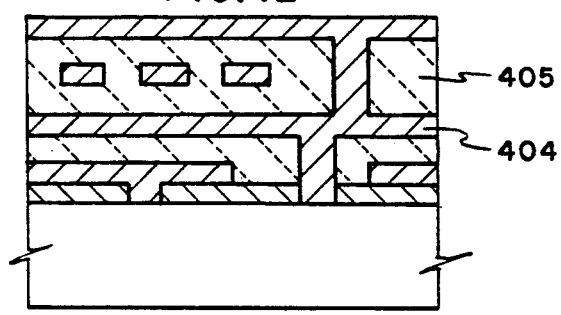

Then, after forming a polyimide film 405 having a thickness of 5000 Å as an interlayer insulating film as shown in FIG. 11, a second metal wiring is formed on the polyimide film 405 as shown in FIG. 12. The case of a multilayered wirings of four layers is illustrated as an example in FIG. 13.

Figure 14:
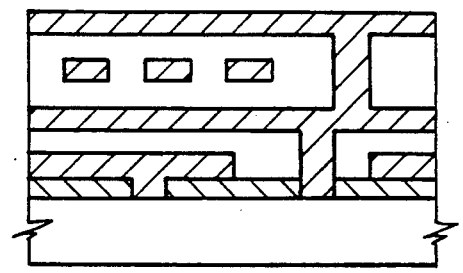
Figure 15:
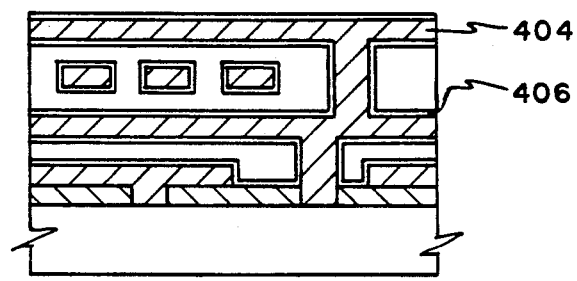

Next, the polyimide films 405 used as the interlayer insulating films are removed completely by an $O_2$ plasma treatment as shown in FIG. 14. Then, a protective insulating film 406 is formed using a compact substance such as silicon nitride to cover the metal wiring 404 as shown in FIG. 15. The protective insulating film 406 is deposited by a plasma CVD method to have a thickness in the range of 500 to 1000 Å.

Figure 16:
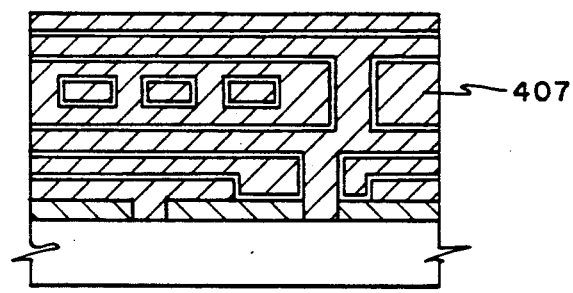
Figure 17:
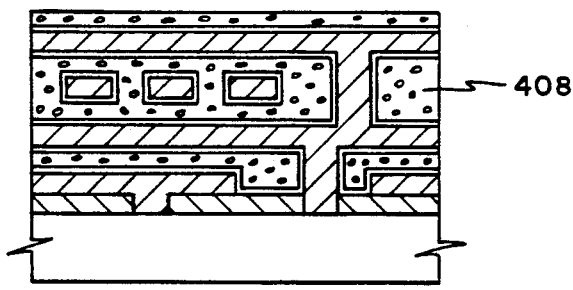

Next, as shown in FIG. 16, after forming a mixed insulating film 407 using a mixed insulator of a basic oxide/an acidic oxide which is microphase separable by heat treatment as described in the first embodiment, the mixed insulating films 407 are converted to porous insulating films as shown in FIG. 17.

In this embodiment, the metal wirings are coated with a protective insulator so that there is obtained an effect of improving the reliability of the wirings compared with the first embodiment.

In the foregoing, the first embodiment as well as the second embodiment are described, but it is possible to realize a variety of alterations and additions. For example, pores can be formed easily by mixing in advance 50 mol % or less of alkyl group such as $CH_3$, $C_2H_5$, $C_3H_7$ in a basic oxide or an acidic oxide, and then removing the alkyl group by subjecting the product to a heat treatment of 300°–500 °C. The heat treatment in this case will become effective by carrying it out in a vacuum of equal to or smaller than 10 Torr in an atmosphere with a trace of nitrogen or oxygen. Moreover, the reliability of the wirings can be enhanced, for example, by adding a step of removing impurities that are sticking to the side walls of the pores by giving a baking after formation of the porous insulating films, by forming an overall passivation film after formation of a multilayered wiring according to the present methods, and the like.

What is claimed is:

1. A method of manufacturing semiconductor device comprising the steps of:
   depositing an insulating film which is a mixture of a basic oxide and an acidic oxide on a semiconductor substrate having semiconductor elements formed thereon;
   subjecting said mixed insulating film to a heat-treatment;
   forming a porous insulating film by selectively removing said basic oxide or said acidic oxide; and
   forming a wiring layer on said porous insulating film.

2. A method of manufacturing semiconductor device comprising the steps of:
   forming a multilayered wirings using an organic substance as an interlayer insulating film;
   removing said organic substance;
   forming a compact insulating film covering the surface of said multilayered wirings;
   forming next an insulating film which is a mixture of a basic oxide and an acidic oxide between said multilayered wirings;
   subjecting said mixed insulating film to a heat treatment; and
   forming a porous insulating film by selectively removing said basic oxide or said acidic oxide.

3. A semiconductor device comprising a semiconductor substrate having semiconductor elements formed therein, an inorganic insulating layer covering said semiconductor substrate, at least one contact hole selectively formed in said inorganic insulating layer to expose at least one part of said semiconductor substrate, first wiring layers selectively formed on said inorganic insulating layer, at least one of said first wiring layers being in contact with said at least one part of said semiconductor substrate via said at least one contact hole, a first porous insulating film formed on said inorganic insulating layer to fill intervals among said first wiring layers and formed on each of said first wiring layers to cover said first wiring layers, second wiring layers selectively formed on said first porous insulating film, and a second porous insulating film formed on said first porous insulating film to fill intervals among said second wiring layers and formed on each of said second wiring layers to cover said second wiring layers, the volume of pores in each of said first and second porous insulating films being in the approximate range from 50% to 80% of the volume of each of said first and second porous insulating films.

4. A semiconductor device as claimed in claim 3, wherein the diameter of the pores of each of said first and second porous insulating films is in the approximate range of 5 nm to 50 nm.

5. The semiconductor device as claimed in claim 3, further comprising third wiring layers selectively formed on said second porous insulating film and a third porous insulating film formed on said second porous insulating film to fill intervals among said third wiring layers and formed on each of said third wiring layers to cover said third wiring layers, the volume of pores in said third porous insulating film being in the approximate range from 50% to 80% of the volume of said third porous insulating film.

6. A semiconductor device comprising a semiconductor substrate having semiconductor elements therein, an inorganic insulating layer covering said semiconductor substrate, at least one first contact hole selectively formed in said inorganic insulating layer to expose at least one part of said semiconductor substrate, first wiring layers selectively formed on said inorganic insulating layer, at least one of said wiring layers being in contact with said at least one part of said semiconductor substrate via said at least one first contact hole, a first porous insulating film formed on said inorganic insulating layer to intervene among said first wiring layers and formed on each of said first wiring layers to cover said first wiring layers, at least one second contact hole selectively formed in said first porous insulating film and said inorganic insulating layer to expose at least another part of said semiconductor substrate, a conductive layer filling said at least one second contact hole in contact with said other part of said semiconductor substrate, second wiring layers selectively formed on said first porous insulating film, at least one of said second wiring layers being in contact with said conductive layer, and a second porous insulating film formed on said first porous insulating film to intervene among said second wiring layers and formed on each of said second wiring layers to cover said second wiring layers, the volume of pores in each of said first and second porous insulating films being in the approximate range from 50% to 80% of the volume of each of said first and second porous insulating films, and each of said first and second porous insulating films having a dielectric constant which is not greater than 2.

7. A semiconductor device as claimed in claim 6, wherein the diameter of the pores of each of said first and second porous insulating films is in the approximate range of 5 nm to 50 nm.

8. A semiconductor device as claimed in claim 3, wherein each of said first and second porous insulating films are made of a material selected from the group of acidic oxides consisting of $SiO_2$, basic inorganic insulators $CaO$, $Na_2O$, and $Li_2O$, and organic insulators polyimide.

9. A semiconductor device as claimed in claim 6, wherein each of said first and second porous insulating films are made of a material selected from the group of acidic oxides consisting of $SiO_2$, basic inorganic insulators $CaO$, $Na_2O$, and $Li_2O$, and organic insulators polyimide.

10. The semiconductor device as claimed in claim 6, further comprising at least one third contact hole selectively formed in said second porous insulating film to expose a part of at least one second wiring layer, an additional conductive layer filling said at least one third contact hole in contact with said part of said at least one second wiring layer, third wiring layers selectively formed on said second porous insulating film, at least one of said third wiring layers being in contact with said additional conductive layer, and a third porous insulating film formed on said second porous insulating film to intervene among said third wiring layers and formed on each of said third wiring layers to cover said third wiring layers, the volume of pores in said third porous insulating film being in the approximate range from 50% to 80% of the volume of said third porous insulating film, and said third porous insulating film has a dielectric constant which is not greater than 2.

11. A semiconductor device comprising a semiconductor substrate having semiconductor elements therein, an inorganic insulating layer covering said semiconductor substrate, at least one contact hole selectively formed in said inorganic insulating layer to expose at least one part of said semiconductor substrate, first wiring layers selectively formed on said inorganic insulating film, at least one of said first wiring layers being in contact with said at least one part of said semiconductor substrate via said at least one contact hole, a first pore-free insulating film formed on each of said first wiring layers, a first porous insulating film formed on said first pore-free insulating film to cover said first wiring layers and intervening among said first wiring layers, second wiring layers selectively formed on said first porous insulating film, a second pore-free insulating film intervening between said first porous insulating film and each of said second wiring layers, a third pore-free insulating film formed on each of said second wiring layers, and a second porous insulating film formed on said third pore-free insulating film to cover said second wiring layers and intervening among said second wiring layers, the volume of pores in each of said first and second porous insulating films being in the range from 50% to 80% of the volume of each of said first and second porous insulating films.

* * * * *